United States Patent
Emura et al.

(10) Patent No.: US 6,202,193 B1
(45) Date of Patent: Mar. 13, 2001

(54) APPARATUS FOR OPTIMIZATION OF CIRCUIT DESIGN

(75) Inventors: Hideyuki Emura; Koichi Sato, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/884,034

(22) Filed: Jun. 27, 1997

(30) Foreign Application Priority Data

Jun. 27, 1996 (JP) .................................................. 8-167373

(51) Int. Cl.$^7$ ...................................................... G06F 17/50
(52) U.S. Cl. .................................. 716/10; 716/9; 716/13
(58) Field of Search ..................................... 364/988–491, 364/578; 395/500.02–500.19; 716/1–21

(56) References Cited

U.S. PATENT DOCUMENTS

| | | | |
|---|---|---|---|
| 5,410,491 | * 4/1995 | Minami | 716/6 |
| 5,559,715 | * 9/1996 | Misheloff | 703/19 |
| 5,619,418 | * 4/1997 | Blaauw et al. | 716/6 |
| 5,638,291 | * 6/1997 | Li et al. | 716/18 |
| 5,654,898 | * 8/1997 | Roetcisoender et al. | 716/9 |
| 5,703,789 | * 12/1997 | Beausang et al. | 716/4 |
| 5,724,250 | * 3/1998 | Kerzman et al. | 716/3 |
| 5,880,967 | * 3/1999 | Jyu et al. | 716/6 |
| 6,009,248 | * 12/1999 | Sato et al. | 716/2 |
| 6,014,506 | * 1/2000 | Hossain et al. | 716/11 |

FOREIGN PATENT DOCUMENTS

| | | | |
|---|---|---|---|
| 5-114006 | 5/1993 | (JP) | G06F/15/60 |
| 6-291190 | 10/1994 | (JP) | H01L/21/82 |
| 7-14927 | 1/1995 | (JP) | H01L/21/82 |

OTHER PUBLICATIONS

PTO 99–2557 (English translation of Japanese Document No. 07–014927, published Jan. 17, 1995, invented by Tsukiboshi, translated by FLS, Inc., Apr. 1999, pp. 1–30).*

PTO 99–2362 (English translation of Japanese Patent Publication, Document No. 06–291190, published Oct. 18, 1994, invented by Yamamoto, translated by Schreiber Translations, Inc., Apr. 1999, pp. 1013).*

PTO 99–2361 (English translation of Japanese Patent Publication, Document No. 5–114006, published May 7, 1993, invented by Fujita et al., Translated by Schreiber Translations, Inc., Apr. 1999, pp. 1–18).*

Sato et al. ("Post–layout optimization for deep submicron design", 1996 Proceedings of 33rd Design Automation Conference, Jun. 3, 1996, pp. 1–5), Jan. 1, 1996.*

Walpole ("Design shows ways to improve tools", Electronic Engineering Times, Nov. 29, 1995, pp. 1–4).*

Lalgudi N. Kannan et al., "A methodology and algorithms for post–placement delay optimization", pp. 327–332, 31st ACM/IEEE Design Automation Conference, 1994. Jan. 1994.

* cited by examiner

Primary Examiner—Matthew Smith
Assistant Examiner—Phallaka Kik
(74) Attorney, Agent, or Firm—Young & Thompson

(57) ABSTRACT

An apparatus for optimization of circuit design such as integrated circuits and printed circuits and an optimization process of the initial layout circuit, from results of the initial layout of the circuits, circuit connection informations after layout, cell positions, and interconnection routing, capacitance and resistance of interconnections are fetched. Optimization is made by local modification to the circuit such as cell placement and buffer insertion in consideration of keeping cell placements and interconnection routing so as to reduce delay, power consumption and circuit scale. Layout information to be changed by the local modification to the circuit is accurately recalculated on the basis of the original layout information. Renewed circuit connection information and newly calculated layout information are transmitted as restriction requirements to the layout section for conducting the relayout.

7 Claims, 9 Drawing Sheets

APPARATUS FOR OPTIMIZATION OF CIRCUIT DESIGN

BACKGROUND OF THE INVENTION

The present invention relates to an apparatus for optimization of circuit design after an initial layout design, has been completed, in circuit design for integrated circuits and printed circuit boards.

DESCRIPTION OF THE RELATED ARTS

In the conventional circuit design of the integrated circuits and printed circuit boards, placement and routing of circuit elements and logic elements have been made by initial layout tools before local modifications to the placement and routing of circuit elements and logic elements are made in order to improve circuit performances or scale down the circuits by an optimization apparatus. On the basis of layout results, placement of cells and routings, interconnection length, interconnection capacitance and interconnection resistance are inputted into the circuit optimizing apparatus so that the optimization apparatus calculates accurate delay and powers of the circuits from the inputted informations for optimization.

FIGS. 1A and 1B are circuit layouts for first and second conventional optimization methods for reducing circuit delay. In FIG. 1A, a small cell 501 is connected through interconnections 510 to cells 502, 503, 504, 505 for driving the same. If the cell 501 for driving a large load has a small driving ability, then a large delay is caused. In this case, the cell 501 having the small driving ability is replaced by another cell 506 which has a higher driving ability but logically equivalent to the former cell 501 so as to reduce the circuit delay. If, however, the cell 501 has a sufficiently large driving ability for driving the cells 502, 503, 504, 505, then the cell 501 is replaced by other cell which has a lower driving ability but suitable for driving the cells 502, 503, 504, 505 for scaling down the circuits, resulting in reduction of power consumption. This measurement is called as cell resizing.

The cell resizing comprises only replacement of the cells without changing and modifying the placement of the cells and routing of the interconnections between the cells. In most cases, the optimization of the circuit design can be achieved by simply applying the cell resizing to the circuit of which the layout has been made, for example, by replacing the cells with other cells without changing or modifying the placement and routing of the circuit design.

In FIG. 2, a buffer 601 is added in the circuit illustrated in FIG. 1A. The buffer divides the load driven by the cell 501 into three divided loads and also divides a long interconnection into two divided interconnections. This measurement is called as buffer insertion.

If the buffer is added on or near the original interconnection with substantially no change to the routing, the desired improvement in delay of the circuit can be obtained. Even if the addition of the buffer results in an increase in the total length of he routing of the circuit, then the circuit delay is improved provided the effects of the load division and interconnection division exceed the influence due to the increase in total length of the routing.

FIG. 3 is a flow chart of the conventional optimization processes which is disclosed in 31st ACM/IEEE Design Automation Conference, 1994 pp. 327–332. First, an initial logic synthesis 701 is carried out before an initial cell placement 702 of the logic-synthesized circuits is then made. Optimization 703 of the circuits is made based upon the results of the initial cell placement 702 for satisfying the circuit requirement for subsequent cell replacement 704 in accordance with the optimization. If the circuit requirement is not yet satisfied, then the processes returns to the further optimization 703 and subsequent cell replacement 704 in accordance with the further optimization 703. Only if all requirements are satisfied, routing process 705 is first made for routing interconnections between the cells. Layout information 710 includes layout information such as cell placements, interconnection routing, interconnection length, interconnection capacitance, and interconnection resistance which are referred by the initial cell placement 702, the optimization 703, the cell replacement 704 and the routing process 705. A circuit modifying information 711 includes information about modifications of routing of the interconnections made in the optimization process and prepared by the optimization process and referred by the cell replacement 704. A cell placement restriction information 72 includes information about placement restriction informations given by the optimization and referred by the cell replacement 704.

The subsequent descriptions focus on the optimization 703 and subsequent cell replacement process 704 where local modifications such as the buffer insertion and the cell resizing are made for satisfying the circuit restriction requirement.

In the buffer insertion, since no routing of the interconnections has yet been made at this stage, a minimal spanning tree is prepared based upon the cell placement information. The buffer is placed at the nodes or near the terminals thereof The minimal spanning tree is a spanning tree being minimum in total length during any spanning trees. The routing delay is calculated by presumption of the minimal spanning tree as the actual routing. FIG. 4 is a view of the minimal spanning tree of the placed cells. Cells 801, 802, 803, 804, 805 are placed at terminals of the minimal spanning tree. The minimal spanning tree has nodes 810 and 811. The buffer is inserted at the terminals or nodes, for which reason the positional restriction of the buffer is supplied to the cell replacement 704 so that the cell replacement 704 tries to place the buffer at the restricted positions possibly.

FIG. 5 is another flow chart of the conventional optimization processes which is disclosed in the Japanese laid-open patent publication No. 5-114006.

First, an initial logic synthesis 901 is carried out before an initial layout 902 of the logic-synthesized circuits is then made. Optimization 903 of the circuits is made based upon the results of the initial layout 902 for satisfying the circuit requirement for subsequent relayout 904 in accordance with the optimization. If the circuit requirement is not yet satisfied, then the processes returns to the further optimization 903 and subsequent relayout 904 in accordance with the further optimization 903. Layout information 910 includes layout information such as cell placements. interconnection routing, interconnection length, interconnection capacitance, and interconnection resistance which are referred by the initial relayout 902, the optimization 903, and the relayout 904. A circuit modifying information 911 includes information about modifications of routing of the interconnections made in the optimization process and prepared by the optimization process and referred by the relayout 904.

The subsequent descriptions focus on the optimization 903 and subsequent relayout process 904.

In the optimization process 903, new nets are added in the circuit without changing the circuit operations and in place redundancy nets are removed. Those processes are repeated, provided that the number of nets to be deleted is kept larger than the number of nets to be added. The cell placement information based on the layout by the initial layout 902 is used to inhibit addition of the net which may prevent post-replacement and routing by the relayout 902. If, for example, a distance of the net connecting cells exceeds a predetermined maximum value, this net addition is inhibited.

In the relayout 904, modification or change of layout is made by using spaced region which has been generated by deleting interconnections or cells in the optimization process 903.

The first conventional optimization of the circuit design has the following disadvantages. In the optimization process 703, the actual routing of the interconnections has not yet been made, for which reason in order to calculate the interconnection delay, the minimal spanning tree is presumed as the actual routing. Notwithstanding, the actual routing is different from the minimal spanning tree, for which reason the estimated delay is largely different from the actual delay.

The second conventional optimization of the circuit design has the following disadvantages. Modification or change of the circuit in the optimization process is made by addition or deletion of nets. In the optimization process, the layout information is used only for the inhibition of the addition of the net but not used for calculation of the delay. Only circuit connection information is transferred from the optimization process to the relayout process. Thus, the calculation of delay in optimization process is inaccurate.

The above first and second conventional optimization processes repeats the optimization process and subsequent replacement or relayout until the circuit restriction requirements are satisfied, for which reason an excessively large number of repeats of the above processes have to be made. This means it difficult to complete the necessary calculations in short time.

In the above circumstances, it had been required to develop a novel optimization process of the circuit design free from the above disadvantages.

SUMMARY OF THE INVENTION

Accordingly, it is an object of the present invention to provide a novel apparatus for optimization of circuit design free from the above disadvantages.

It is a further object of the present invention to provide a novel apparatus for optimization of circuit design which is capable of accurate calculations of circuit delay and power consumption by use of information about the initial layout already made.

It is a still further object of the present invention to provide a novel apparatus for optimization of circuit design which is capable of providing restriction on layout to the relayout process so that the relayout process is made to approach layout information presumed in the optimization process to suppress a difference of estimation and actual relayout to reduce the number of repetitions of the optimization processes for completion of the circuit design in a short time.

The above and other objects, features and advantages of the present invention will be apparent from the following descriptions.

The present invention provides an apparatus for optimization of circuit design such as integrated circuit and printed circuit. In the optimization process of the initial layout circuit, from results of the initial layout of the circuits, circuit connection information after layout, cell positions, and route, capacitance and resistance of interconnections are fetched. Optimization is made by local modification to the circuit such as cell placement and buffer insertion in consideration of keeping cell placements and interconnection routing so as to reduce delay, power consumption and circuit scale. Layout information to be changed by the local modification to the circuit is accurately recalculated on the basis of the original layout information. Renewed circuit connection information and newly calculated layout information are transmitted as restriction requirements to the layout section for conducting the relayout.

The recalculation is made to the layout information to be changed by the local modification to the circuit by using the initial layout information on the replaced cell or use of the value varied at constant rate from the values of the initial layout information. Alternatively, the recalculation is made to the layout information to be changed by the local modification to the circuit by calculation of divided capacitances and resistances by the cell insertion in accordance with the proportional distribution in divided interconnection lengths based upon the original interconnections or by varying at constant rate from the calculated values in the above measures.

BRIEF DESCRIPTIONS OF THE DRAWINGS

Preferred embodiments according to the present invention will be described in detail with reference to the accompanying drawings.

PREFERRED EMBODIMENTS

Figure 1A:
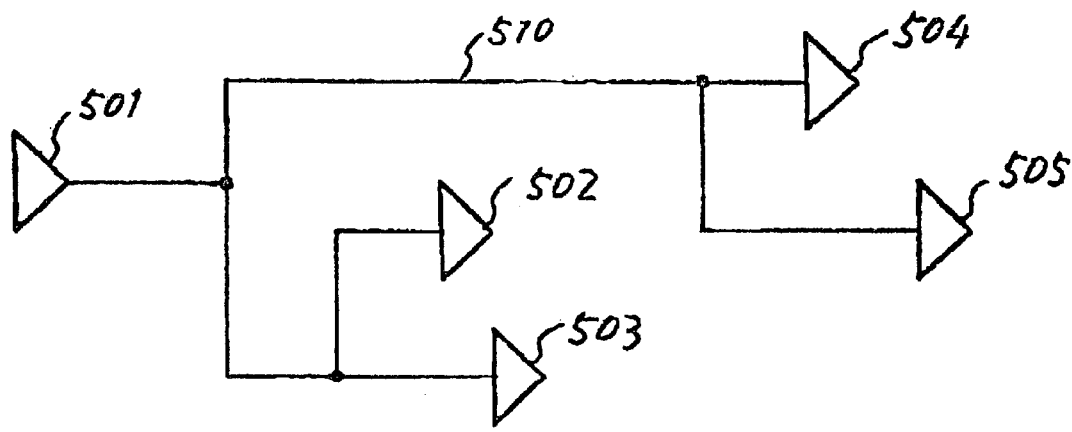
FIGS. 1A and 1B are circuit layouts for first and second conventional optimization methods for reducing circuit delay by cell resizing.
Figure 1B:
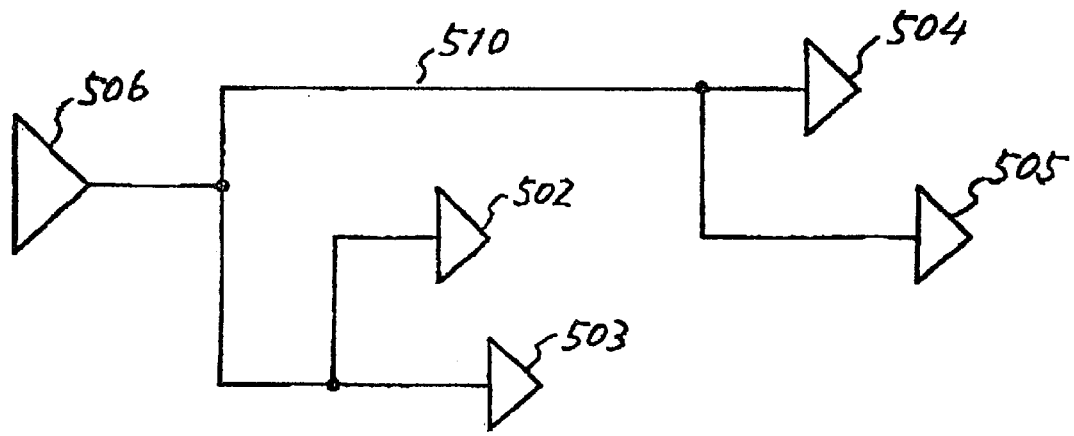
Figure 2:
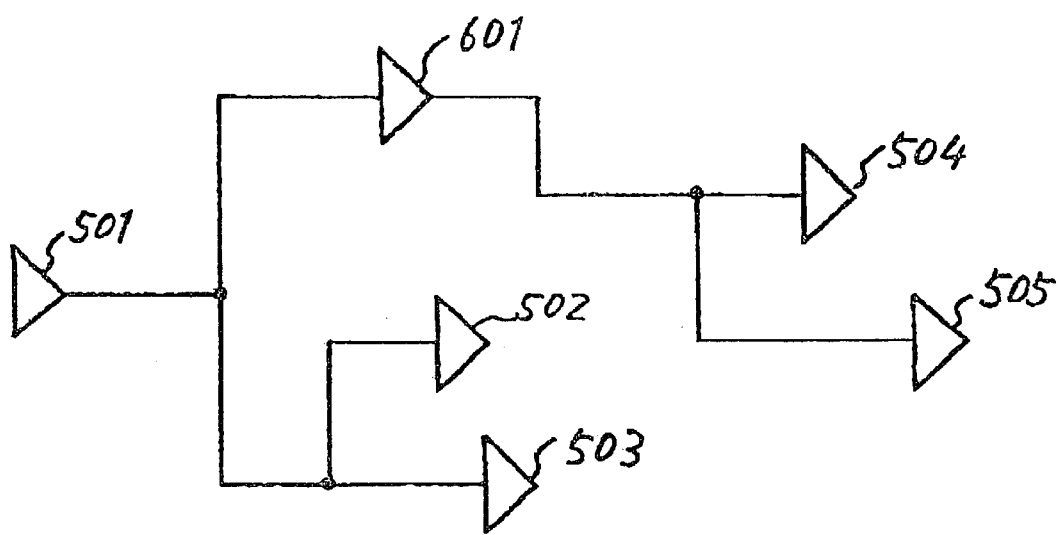
FIG. 2 is a circuit layout for the conventional optimization method by the buffer insertion.
Figure 3:
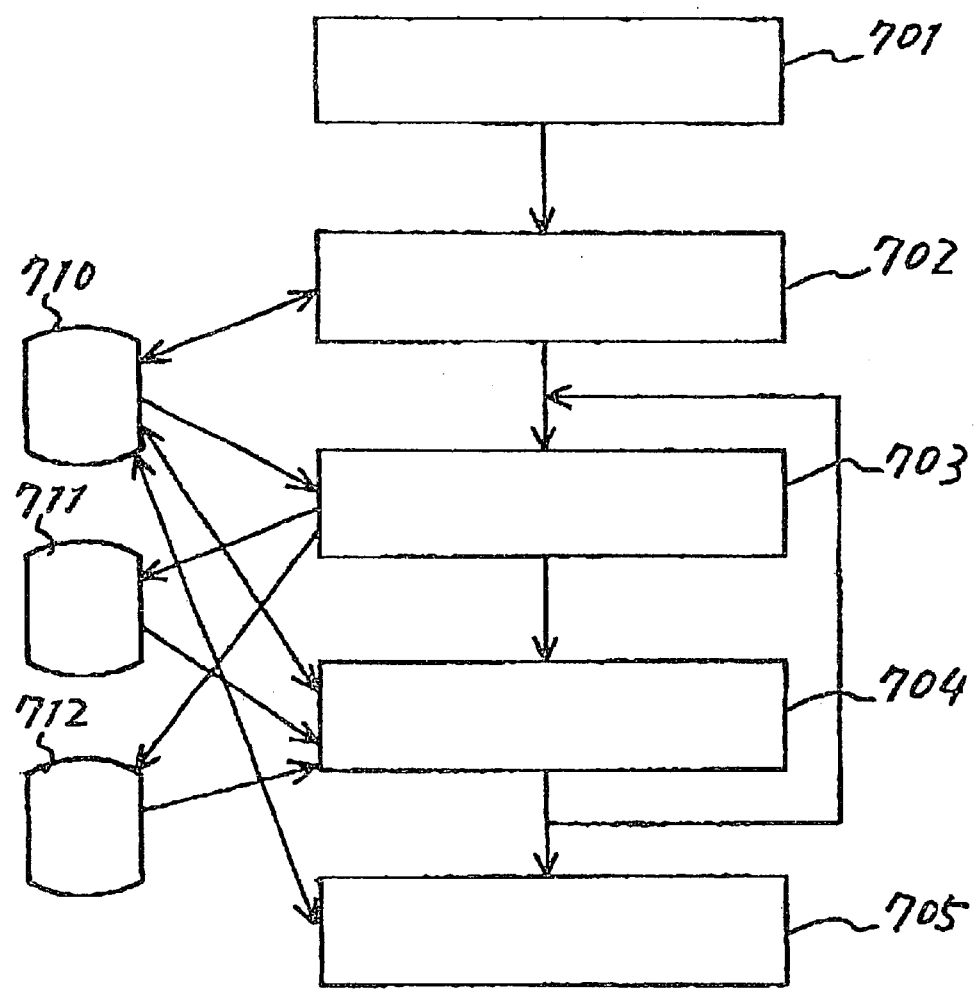
FIG. 3 is a flow chart illustrative of the first conventional optimization processes.
Figure 4:
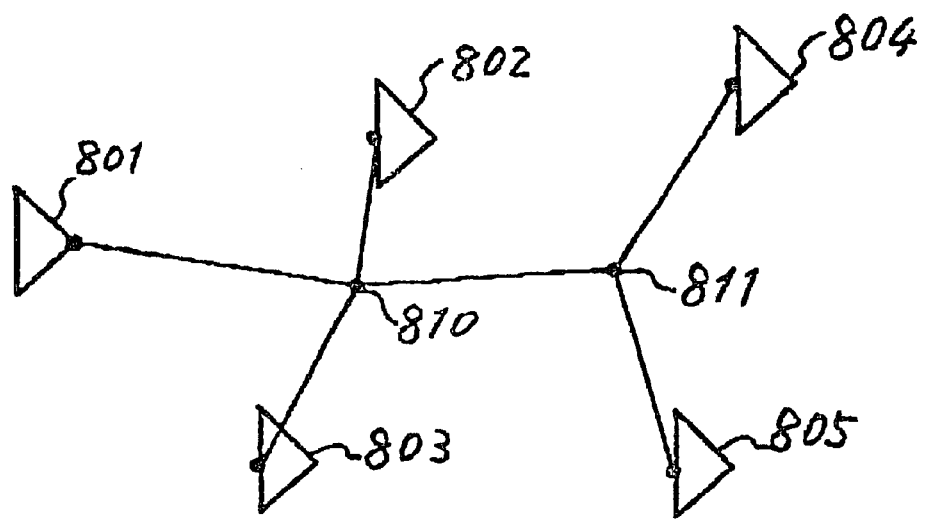
FIG. 4 is a view illustrative of a minimal spanning tree in the conventional optimization process.
Figure 5:
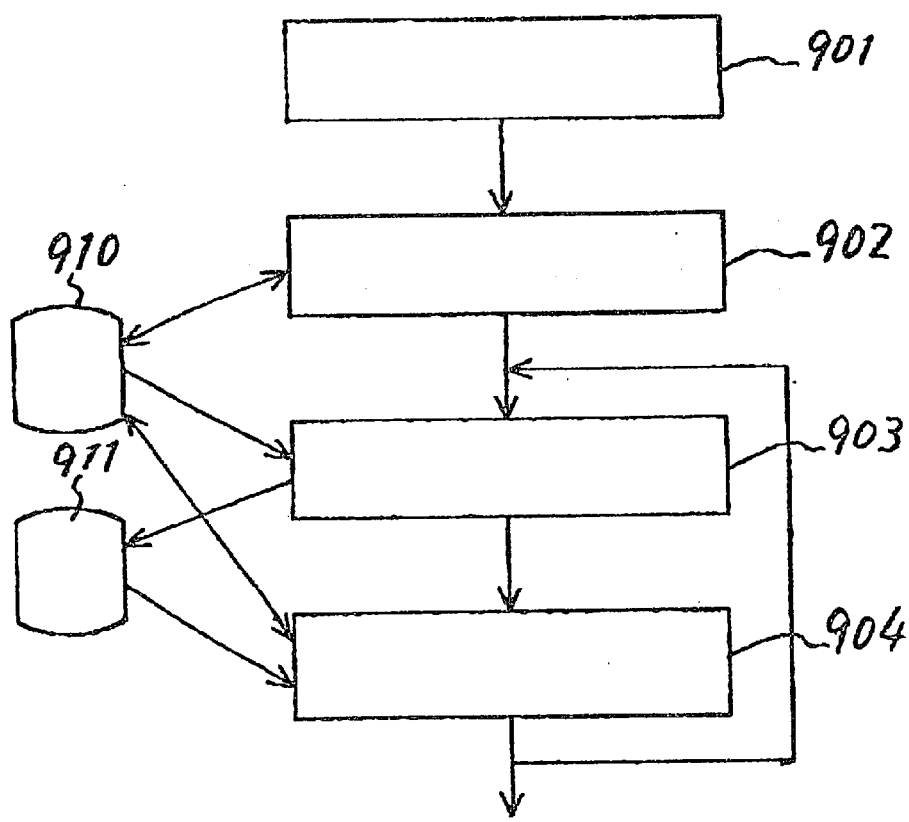
FIG. 5 is a flow chart illustrative of the second conventional optimization processes.
Figure 6:
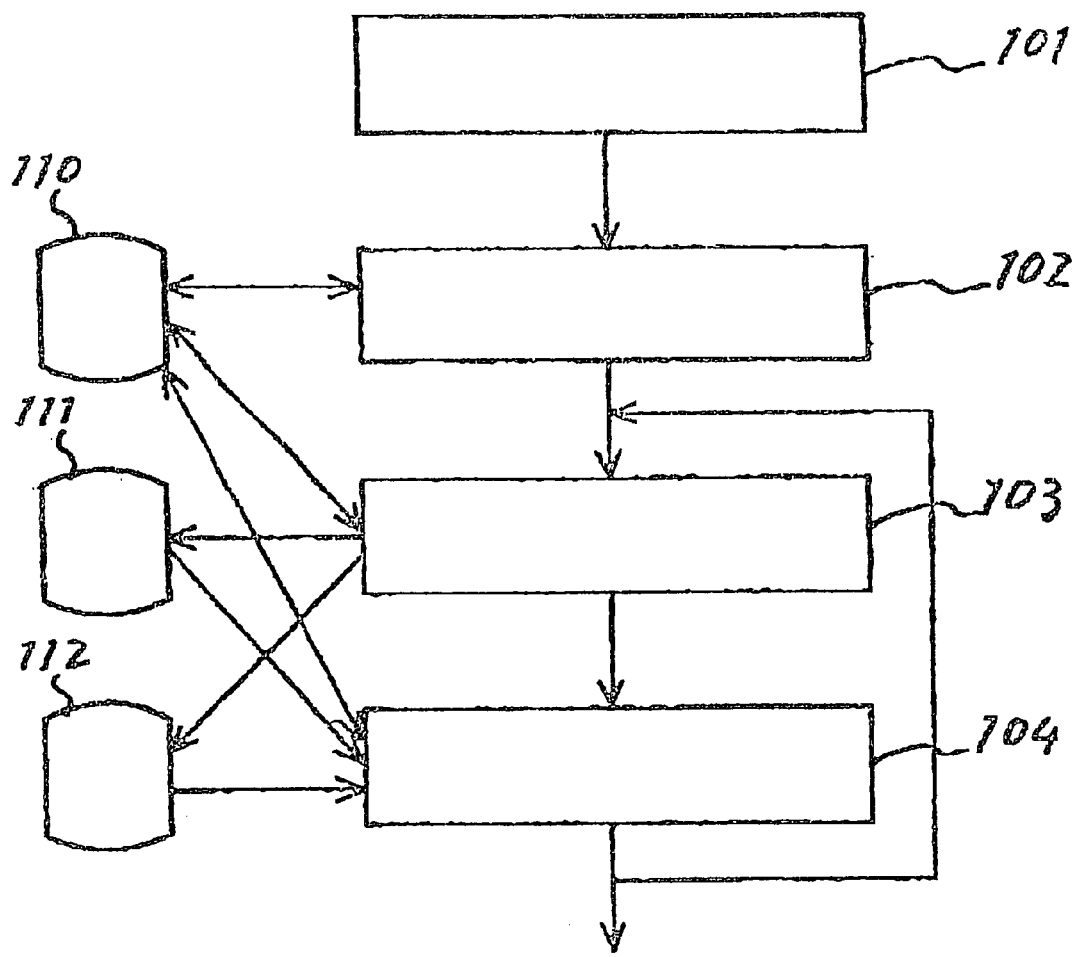
FIG. 6 is a flow chart illustrative of a novel optimization processes in a preferred embodiment according to the present invention.

A first embodiment according to the present invention will be described. First, an initial logic synthesis 101 is carried out before an initial layout 102 of the logic-synthesized circuits is then made to prepare layout information 110 to be used in post-processes. Layout information 110 includes layout informations such as cell placements, interconnection routing, interconnection length, interconnection capacitance, and interconnection resistance which are referred by the initial relayout 102. the optimization 103, and the layout 104.

Optimization 103 of the circuits is made based upon the results of the initial layout 102 for satisfying the circuit requirement for subsequent relayout 104 in accordance with the optimization. If the circuit requirement is not yet satisfied, then the processes returns to the further optimization 103 and subsequent relayout 104 in accordance with the further optimization 103. A circuit modifying information 111 includes information about modifications of routing of the interconnections made in the optimization process and prepared by the optimization process and referred by the relayout 104. Optimization 103 is made by local modification to the circuit such as cell placement and buffer insertion in consideration of keeping cell resizing and interconnection routing so as to reduce delay, power consumption and circuit scale. Layout information 110 to be changed by the local modification to the circuit is accurately recalculated on the basis of the original layout information. Renewed circuit connection informations and newly calculated layout information are transmitted as restriction requirement to the layout section 104 for conducting the relayout. Restriction information 112 includes informations about layout restriction information given by the optimization 103 and referred by the relayout section 104.

The layout process is made to the locally modified portion in the optimization process based upon the result of the initial layout section 102, provide that the layout restriction requirement 112 is satisfied.

The subsequent descriptions focus on the optimization 103 and subsequent relayout process 104.

Figure 7:
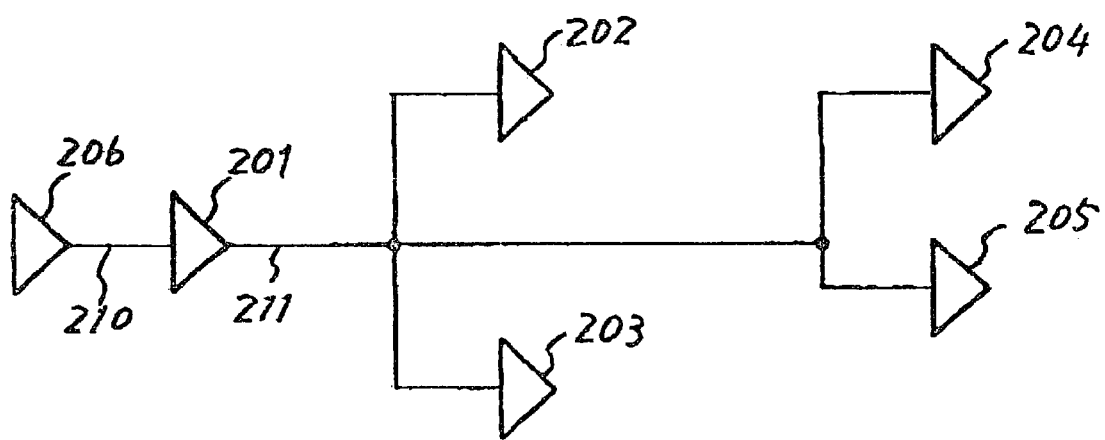
FIG. 7 is a circuit layout for a novel optimization method by cell resizing.

In FIG. 7, for the cell 201, the to be driven by the cell 201 is too large, for which reason in the optimization process 103, gate resizing to the cell 201 will be made to improve the delay. If the cells to be subjected to gate-resizing exit critical passes in the circuits and delay of the cells are large, then one of largest effects for improvement in delay with reference to the capacitance, resistance and delay of the interconnections is first selected to be subjected to the gate-resizing.

Figure 8A:
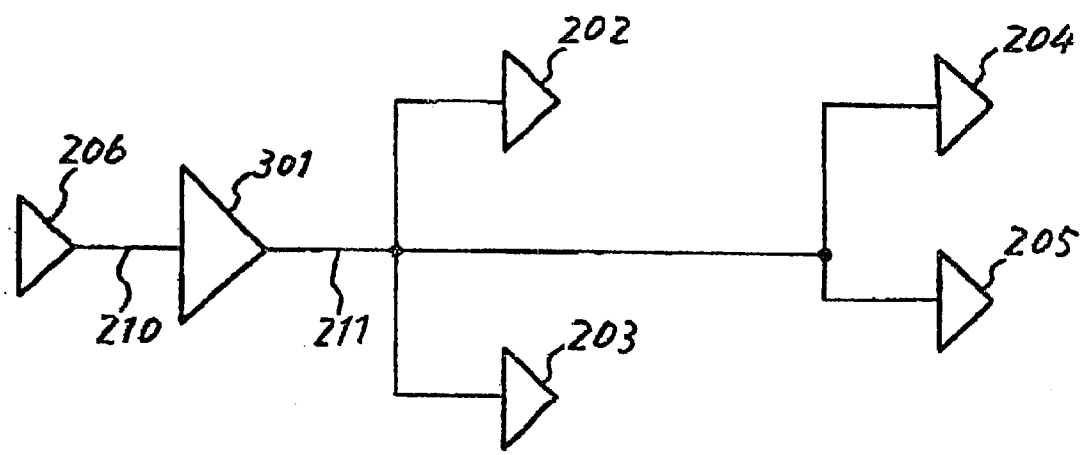
FIGS. 8A and 8B are other circuit layouts for a novel optimization method by cell resizing.
Figure 8B:
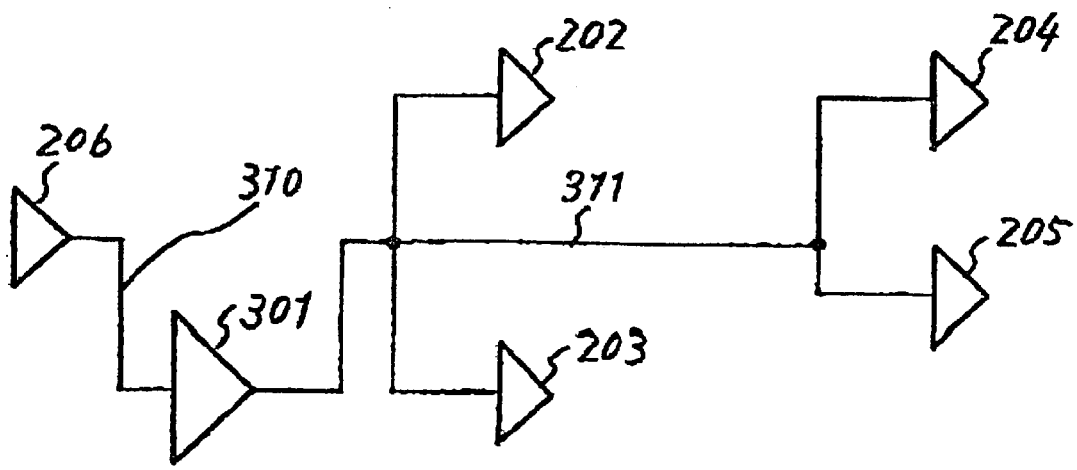

In FIG. 8A, the cell 201 was replaced by a cell 301 of a large driving ability. Since the new cell replaced may at a high probability remain at the original cell position in the relayout process, it may be possible to presume no change nor modification in routing and position of the interconnections. If the cell 201 was replaced by the cell 301, then the delay is calculated by using the capacitance and resistance of the original interconnections 210 and 211. If, however, the actual placement position of the cell 301 is different from the cell 201, or if the routing of the interconnections 210 and 211 are different from the original ones, it is possible to vary at a constant rate the values from the original layout information. The delay is recalculated based upon the routing layout information. If the delay is improved, the replacement of the cell 201 by the cell 301 is made.

If there are a plurality of cells equivalent to the cell 201, the replacements are made to all the equivalent cells to find out and select proper replacement in the light of improvement in delay or variation in circuit area and other factors if any. If no proper candidate could be found and any critical pass will still remain after replacement, the cell resizing is tried to be made to the other cells.

In the optimization process 103, the restriction requirement 112 is issued to the relayout section 104 for placement position and delay of the new cell and length, capacitance, resistance and delay of the interconnections connected to the new cell.

In the relayout section 104, the relayout process is made only to the modified portion of the circuit in the optimization process 103 based upon the result of the initial layout process 102 so as to satisfy the restriction requirement for layout possibility. For the modification in FIG. 8A, the cell 301 is tried to be replaced at the original position of the cell 201 replaced in accordance with the conventional layout restriction. If it is impossible to place the cell 301 at the position of the cell 201, then the cell is placed at a position so as to satisfy the restriction requirement for the length, capacitance, resistance and delay of the interconnection connected to the cell 301. In this case, the interconnections 210 and 211 are changed into different interconnections 310 and 311.

Figure 9:
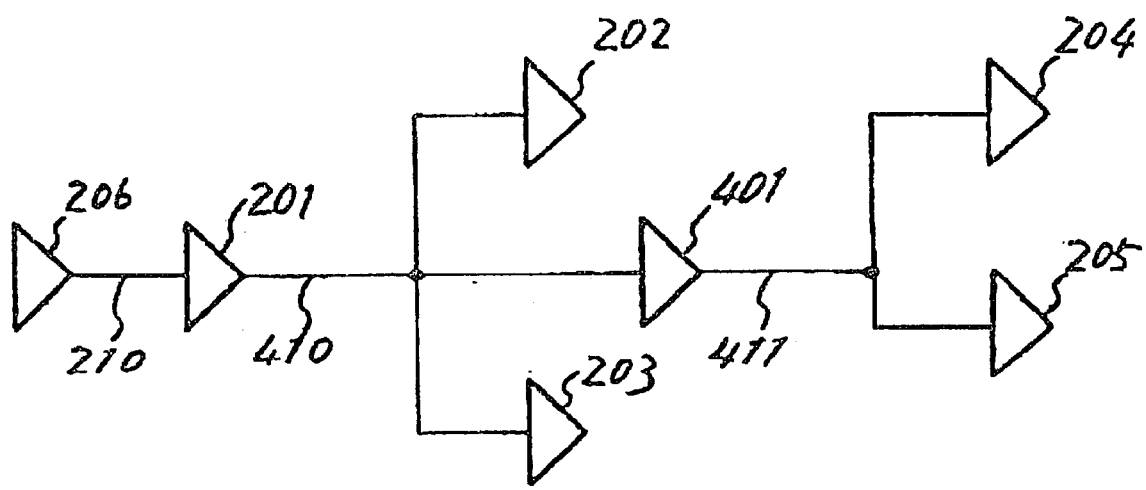
FIG. 9 is still another circuit layout for a novel optimization method by buffer insertion.

In FIG. 9, the buffer cell 401 is inserted on the interconnection 211 for improvement delay from the cells 201 to 205. The insertion interconnection is one selected from the interconnections present in the critical passes and providing the largest effect in the light of the length, capacitance, resistance, and delay of the interconnections.

The optimization process 103 is made to insert the cell on the pre-existed interconnection 211. After insertion of the cell 401, the interconnection 211 is divided into the interconnections 410 and 411 by the insertion cell 401. Any further interconnections remain unchanged. The recalculation is made to the layout information to be changed by the local modification to the circuit by calculation of divided capacitances and resistances by the insertion cell 401 in accordance with the proportional distribution in divided interconnection lengths based upon the original interconnections or by varying at constant rate from the calculated values in the above measures. If the delay is improved, then the modification is made.

If there are a plurality of insertion buffers, the replacements are made to all the insertion buffers to find out and select proper replacement in the light of improvement in delay or variation in circuit area and other factors if any. If no proper candidate could be found and any critical pass will still remain after replacement, the cell resizing is tried to be made to the other cells.

In the optimization process 103, the restriction requirement 112 is issued to the relayout section 104 for placement position and delay of the insertion cell and length, capacitance, resistance and delay of the interconnections connected to the insertion cell.

In the relayout section 104, the relayout process is made only to the modified portion of the circuit in the optimization process 103 based upon the result of the initial layout process 102 so as to satisfy the restriction requirement for layout possibly.

In the optimization process 103, since the cell resizing causes no modification to the routing, if the desired effects can be obtained, then it is preferable to use the cell resizing. On the other hand, it is effective to insert the buffer cell on a long interconnection to divide the long interconnection into the divided ones.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. An apparatus for optimization of circuit design comprising:

means for fetching from results of an initial layout of a circuit, circuit connection information after layout, cell positions, interconnection routing, capacitance and resistance of interconnections in an optimization process of the initial layout of the circuit, means for optimization by local modification to the circuit in consideration of keeping cell placements and interconnection routing so as to reduce delay, power consumption and circuit scale, means for recalculation layout information to be changed by the local modification to the circuit on the basis of initial layout information; and means for transmitting renewed circuit connection information and newly recalculated layout information as restriction requirements to a relayout section for conducting the relayout.

2. The apparatus as claimed in claim 1, wherein the optimization is made by cell resizing.

3. The apparatus as claimed in claim 1, wherein the optimization is made by buffer insertion.

4. The apparatus as claimed in claim 1, wherein the recalculation is made to the layout information to be changed by the local modification to the circuit by using the initial layout information on the replaced cell.

5. The apparatus as claimed in claim 1, wherein the recalculation is made to the layout information to be changed by the local modification to the circuit by using circuit characteristic values varied at constant rate from the circuit characteristic values of the initial layout information.

6. The apparatus as claimed in claim 1, wherein the recalculation is made to the layout information to be changed by the local modification to the circuit by calculation of divided capacitances and resistances by the cell insertion in accordance with the proportional distribution in divided interconnection lengths based upon the original interconnections.

7. The apparatus as claimed in claim 6, wherein the recalculation is made to the layout information to be changed by the local modification to the circuit by calculation of divided capacitances and resistances by varying at constant rate from the calculated divided capacitances and resistances values.

* * * * *